(12) United States Patent
Wang

(10) Patent No.: US 12,261,243 B2
(45) Date of Patent: Mar. 25, 2025

(54) LIGHT-EMITTING DIODE, LIGHT-EMITTING SUBSTRATE, AND DISPLAY DEVICE

(71) Applicant: TCL CHINA STAR OPTOELECTRONICS TECHNOLOGY CO., LTD., Shenzhen (CN)

(72) Inventor: Jiao Wang, Shenzhen (CN)

( * ) Notice: Subject to any disclaimer, the term of this patent is extended or adjusted under 35 U.S.C. 154(b) by 0 days.

(21) Appl. No.: 17/764,990

(22) PCT Filed: Mar. 29, 2022

(86) PCT No.: PCT/CN2022/083612
§ 371 (c)(1),
(2) Date: Mar. 30, 2022

(87) PCT Pub. No.: WO2023/173478
PCT Pub. Date: Sep. 21, 2023

(65) Prior Publication Data
US 2024/0055559 A1    Feb. 15, 2024

(30) Foreign Application Priority Data
Mar. 14, 2022    (CN) .......................... 202210245484.0

(51) Int. Cl.
*H01L 33/00* (2010.01)
*G02F 1/13357* (2006.01)
(Continued)

(52) U.S. Cl.
CPC ........ *H01L 33/24* (2013.01); *G02F 1/133603* (2013.01); *G02F 1/133608* (2013.01);
(Continued)

(58) Field of Classification Search
CPC ......... G02F 1/133603; G02F 1/133608; H01L 33/24; H01L 33/10; H01L 33/46
See application file for complete search history.

(56) References Cited

U.S. PATENT DOCUMENTS

2005/0264172 A1    12/2005    Wojnarowski
2009/0039362 A1    2/2009    Han
(Continued)

FOREIGN PATENT DOCUMENTS

CN    102472909 A    5/2012
CN    114050210 A    2/2022
(Continued)

OTHER PUBLICATIONS

Chinese Office Action issued in corresponding Chinese Patent Application No. 202210245484.0 dated Jun. 28, 2024, pp. 1-8.

*Primary Examiner* — Gerald J Sufleta, II

(57) ABSTRACT

A light-emitting diode, a light-emitting substrate, and a display device are provided. The light-emitting diode includes a first semiconductor layer, a light-emitting layer, a second semiconductor layer, and a first protective layer disposed in sequence. The second semiconductor layer is located on a light-emitting surface of the light-emitting layer. The light-emitting diode includes at least one convergence surface, and the at least one convergence surface includes a surface of the second semiconductor layer away from the light-emitting layer and/or a surface of the first protective layer away from the second semiconductor layer.

18 Claims, 6 Drawing Sheets

(51) Int. Cl.
*H01L 25/075* (2006.01)
*H01L 33/10* (2010.01)
*H01L 33/24* (2010.01)
*H01L 33/46* (2010.01)

(52) U.S. Cl.
CPC .......... *H01L 25/0753* (2013.01); *H01L 33/10* (2013.01); *H01L 33/46* (2013.01)

(56) References Cited

U.S. PATENT DOCUMENTS

| | | |
|---|---|---|
| 2009/0225567 A1 | 9/2009 | Mori et al. |
| 2010/0047944 A1 | 2/2010 | Kim |
| 2018/0269352 A1* | 9/2018 | Tian .................... H01L 25/0753 |
| 2019/0019839 A1* | 1/2019 | Tian ...................... H01L 33/405 |
| 2022/0308413 A1* | 9/2022 | Liao .................... G02F 1/13606 |
| 2023/0317877 A1* | 10/2023 | Guo ...................... H01L 33/405 |
| | | 257/79 |
| 2023/0352517 A1* | 11/2023 | Ohshima .............. H10K 59/122 |

FOREIGN PATENT DOCUMENTS

| | | |
|---|---|---|
| JP | H06302853 A | 10/1994 |
| JP | 2011211082 A | 10/2011 |

* cited by examiner

LIGHT-EMITTING DIODE, LIGHT-EMITTING SUBSTRATE, AND DISPLAY DEVICE

FIELD OF INVENTION

The present disclosure relates to the field of display technologies, and more particularly, to a light-emitting diode, a light-emitting substrate, and a display device.

BACKGROUND OF INVENTION

Compared to conventional liquid crystal displays (LCDs), total reflective LCD display products can realize picture display without additional backlight sources. Therefore, from the perspective of energy efficiency and applicability of environment, the total reflective LCD display products have more advantages. Due to limitation of total reflective LCD display technology, a reflectivity of the total reflective LCD display products is not high enough, which leads to the total reflective LCD display products having a darker display screen when the ambient light has a lower brightness.

Technical problem: at present, the total reflective LCD display products usually use light-emitting diodes (LEDs) as light sources for improving the brightness of the display screen. However, a collimation effect of current LEDs is poorer, thereby causing display uniformity of display products to be poorer.

SUMMARY OF INVENTION

An embodiment of the present disclosure provides a light-emitting diode, a light-emitting substrate, and a display device. By improving the collimation effect of the light-emitting diode, the display uniformity of the total reflective LCD display products using the light-emitting diode can be improved.

An embodiment of the present disclosure provides a light-emitting diode, which includes:
 a first semiconductor layer;
 a light-emitting layer disposed on the first semiconductor layer;
 a second semiconductor layer disposed on one side of the light-emitting layer away from the first semiconductor layer and located on a light-emitting surface of the light-emitting layer; and
 a first protective layer disposed on one side of the second semiconductor layer away from the light-emitting layer;
 wherein, the light-emitting diode includes at least one convergence surface, and the at least one convergence surface includes a surface of the second semiconductor layer away from the light-emitting layer and/or a surface of the first protective layer away from the second semiconductor layer.

Optionally, in some embodiments of the present disclosure, the at least one convergence surface protrudes outward along a direction from the first semiconductor layer toward the light-emitting layer.

Optionally, in some embodiments of the present disclosure, the surface of the second semiconductor layer away from the light-emitting layer is a first convergence surface, and the first convergence surface protrudes outward along a direction from the first semiconductor layer toward the light-emitting layer; and the second semiconductor layer has a first bottom surface, and the first bottom surface is in contact with the light-emitting surface of the light-emitting layer and is connected to the first convergence surface.

Optionally, in some embodiments of the present disclosure, the surface of the first protective layer away from the second semiconductor layer is a second convergence surface, and the second convergence surface protrudes outward along a direction from the light-emitting layer toward the second semiconductor layer; and the first protective layer has a second bottom surface, and the second bottom surface is in contact with the first convergence surface and is connected to the second convergence surface.

Optionally, in some embodiments of the present disclosure, an orthographic projection of the first protective layer on a plane where the first semiconductor layer is located is within an orthographic projection of the second semiconductor layer on the plane where the first semiconductor layer is located, and in a direction from the first semiconductor layer to the light-emitting layer, a horizontal cross-sectional area of the second semiconductor layer decreases.

An embodiment of the present disclosure provides a light-emitting substrate, which includes a substrate and a light-emitting diode disposed on the substrate, wherein the light-emitting diode includes:
 a first semiconductor layer;
 a light-emitting layer disposed on the first semiconductor layer;
 a second semiconductor layer disposed on one side of the light-emitting layer away from the first semiconductor layer and located on a light-emitting surface of the light-emitting layer; and
 a first protective layer disposed on one side of the second semiconductor layer away from the light-emitting layer;
 wherein, the light-emitting diode includes at least one convergence surface, and the at least one convergence surface includes a surface of the second semiconductor layer away from the light-emitting layer and/or a surface of the first protective layer away from the second semiconductor layer.

Optionally, in some embodiments of the present disclosure, the at least one convergence surface protrudes outward along a direction from the first semiconductor layer toward the light-emitting layer.

Optionally, in some embodiments of the present disclosure, the surface of the second semiconductor layer away from the light-emitting layer is a first convergence surface, and the first convergence surface protrudes outward along a direction from the first semiconductor layer toward the light-emitting layer; and the second semiconductor layer has a first bottom surface, and the first bottom surface is in contact with the light-emitting surface of the light-emitting layer and is connected to the first convergence surface.

Optionally, in some embodiments of the present disclosure, the surface of the first protective layer away from the second semiconductor layer is a second convergence surface, and the second convergence surface protrudes outward along a direction from the light-emitting layer toward the second semiconductor layer; and the first protective layer has a second bottom surface, and the second bottom surface is in contact with the first convergence surface and is connected to the second convergence surface.

Optionally, in some embodiments of the present disclosure, an orthographic projection of the first protective layer on a plane where the first semiconductor layer is located is within an orthographic projection of the second semiconductor layer on the plane where the first semiconductor layer is located, and in a direction from the first semiconductor layer to the light-emitting layer, a horizontal cross-sectional area of the second semiconductor layer decreases.

An embodiment of the present disclosure further provides a display device which includes:
- a framework including a bottom plate and a side wall disposed on the bottom plate;
- a total reflective liquid crystal display panel disposed on the bottom plate; and
- a light-emitting substrate disposed on at least one inner surface of the side wall, wherein, one side of the light-emitting substrate provided with a light-emitting diode faces the total reflective liquid crystal display panel, and the light-emitting substrate is the light-emitting substrate described in the foregoing embodiments.

Optionally, in some embodiments of the present disclosure, in a long-side direction of the display device, the side wall has a first inner surface and a second inner surface disposed opposite to each other, and the first inner surface and the second inner surface are both provided with the light-emitting substrate.

Optionally, in some embodiments of the present disclosure, the light-emitting substrate further includes a first light-blocking part disposed on one side of the light-emitting diode facing the total reflective liquid crystal display panel and covering peripheries of the light-emitting diode.

Optionally, in some embodiments of the present disclosure, the light-emitting substrate further includes a second light-blocking part covering a side surface of the light-emitting diode.

Optionally, in some embodiments of the present disclosure, the light-emitting substrate further includes a reflective component disposed on the substrate, one side of the reflective component away from the substrate is provided with a groove, a surface of the groove is a reflective curved surface, and the light-emitting diode is accommodated in the groove.

Optionally, in some embodiments of the present disclosure, the display device further includes a coverplate, the coverplate and the framework together form a closed chamber, the closed chamber is provided with an air bag, a gas for refraction is filled in the air bag, and a refractive index of the gas for refraction is greater than a refractive index of air.

Optionally, in some embodiments of the present disclosure, at least one of the coverplate or the framework is provided with an inflatable port connected to the air bag.

Optionally, in some embodiments of the present disclosure, the bottom plate has a first section and a second section adjacent to the first section, the total reflective liquid crystal display panel is disposed on the first section, and the inflatable port is disposed on the second section.

Optionally, in some embodiments of the present disclosure, the side wall is provided with a reflective concave surface having an arc shape, and the light-emitting substrate is disposed on the reflective concave surface.

Optionally, in some embodiments of the present disclosure, the display device further includes a reflective layer disposed on the reflective concave surface.

Beneficial effect: compared to current light-emitting diodes, the light-emitting diode of the present disclosure includes the at least one convergence surface, and the at least one convergence surface includes the surface of the second semiconductor layer away from the light-emitting layer and/or the surface of the first protective layer away from the second semiconductor layer. When light emitted from the light-emitting layer is incident on the at least one convergence surface, using the convergence effect of the at least one convergence surface on the light, an angle of emergence of light emitted from the at least one convergence surface will be reduced, thereby improving the collimation effect of the light-emitting diode. When the light-emitting diode is applied to total reflective LCD display products, display uniformity of the total reflective LCD display products can be improved.

DESCRIPTION OF DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
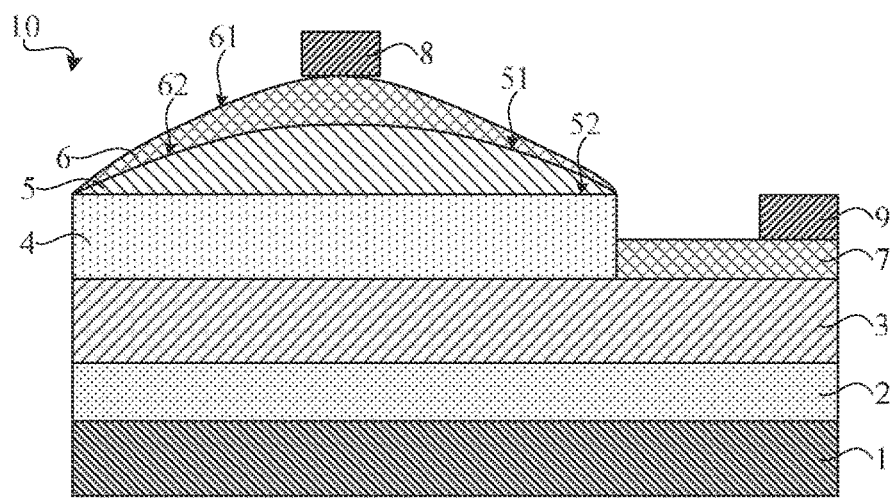
FIG. 1 is a schematic structural diagram of a light-emitting diode according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure, and are not used to limit the disclosure. In the present disclosure, in the case of no explanation to the contrary, the orientation words used such as "on" and "under" usually refer to upper and lower directions of the device in actual use or working state, specifically the directions in the drawings, and "inside" and "outside" refer to the outline of the device.

The embodiments of the present disclosure provide a light-emitting diode, a light-emitting substrate, and a display device. They will be described in detail in the following. It should be noted that an order of description in the following embodiments is not meant to limit a preferred order of the embodiments.

The present disclosure provides the light-emitting diode. The light-emitting diode includes a first semiconductor layer, a light-emitting layer, a second semiconductor layer, and a first protective layer. The light-emitting layer is disposed on the first semiconductor layer. The second semiconductor layer is disposed on one side of the light-emitting layer away from the first semiconductor layer and is located on a light-emitting surface of the light-emitting layer. The first protective layer is disposed on one side of the second semiconductor layer away from the light-emitting layer. wherein, the light-emitting diode includes at least one convergence surface, and the at least one convergence surface includes a surface of the second semiconductor layer away from the light-emitting layer and/or a surface of the first protective layer away from the second semiconductor layer.

Therefore, the light-emitting diode of the present disclosure is provided with the at least one convergence surface, and the at least one convergence surface includes the surface of the second semiconductor layer away from the light-emitting layer and/or the surface of the first protective layer away from the second semiconductor layer. When light emitted from the light-emitting layer is incident on the at least one convergence surface, using the convergence effect of the at least one convergence surface on the light, an angle of emergence of light emitted from the at least one convergence surface will be reduced, thereby improving the collimation effect of the light-emitting diode. When the light-emitting diode is applied to total reflective LCD display products, display uniformity of the total reflective LCD display products can be improved.

The light-emitting diode of the present disclosure will be described in detail below in conjunction with specific embodiments.

Referring to FIG. 1, the embodiment of the present disclosure provides a light-emitting diode 10. The light-emitting diode 10 includes a base substrate 1, a buffer layer 2, a first semiconductor layer 3, a light-emitting layer 4, a second semiconductor layer 5, a first protective layer 6, a second protective layer 7, a first electrode 8, and a second electrode 9.

Specifically, the base substrate 1 may be a sapphire base substrate, a gallium arsenide base substrate, or a silicon base substrate. In this embodiment, the base substrate 1 is the sapphire base substrate.

The buffer layer 2 is disposed on one side of the base substrate 1. A material of the buffer layer 2 may include gallium nitride.

The first semiconductor layer 3 is disposed on one side of the buffer layer 2 away from the base substrate 1. In this embodiment, the first semiconductor layer 3 is an N-type semiconductor layer, and a material of the N-type semiconductor layer includes N-type gallium nitride.

The light-emitting layer 4 is disposed on one side of the first semiconductor layer 3 away from the buffer layer 2. light-emitting layer 4 has a light-emitting surface. Wherein, the light-emitting layer 4 is a multiple-quantum-well structure, and the multiple-quantum-well structure may include a stacked structure of a gallium nitride layer and an indium gallium nitride layer.

The second semiconductor layer 5 is disposed on one side of the light-emitting layer 4 away from the first semiconductor layer 3. The second semiconductor layer 5 is located on the light-emitting surface of the light-emitting layer 4. In this embodiment, the second semiconductor layer 5 is a P-type semiconductor layer, and a material of the P-type semiconductor layer includes P-type gallium nitride.

The first protective layer 6 is disposed on one side of the second semiconductor layer 5 away from the light-emitting layer 4. A refractive index of the first protective layer 6 is less than a refractive index of the second semiconductor layer 5 and greater than a refractive index of the air. Wherein, a material of the first protective layer 6 may include one or more of silicon oxide, silicon nitride, or silicon oxynitride.

In this embodiment, the light-emitting diode 10 includes at least one convergence surface. It can be understood that the convergence surface is used to converge light, converging light refers to reducing an angle of emergence of light incident on the convergence surface to converge the light. Wherein, the at least one convergence surface protrudes outward along a direction from the first semiconductor layer 3 toward the light-emitting layer 4.

By the above setting, when the light emitted from the light-emitting surface of the light-emitting layer 4 enters the convergence surface, incident light on the convergence surface will be refracted on the convergence surface, and the angle of emergence of refracted light on the convergence surface will decrease, so that the refracted light will converge toward a center of the light-emitting diode 10, thereby improving the collimation effect of the light-emitting diode 10.

Specifically, the at least one convergence surface includes a first convergence surface 51 and a second convergence surface 61. The surface of the second semiconductor layer 5 away from the light-emitting layer 4 is the first convergence surface 51. The second semiconductor layer 5 has a first bottom surface 52. The first bottom surface 52 is in contact with the light-emitting surface of the light-emitting layer 4 and is directly connected to the first convergence surface 51. The first convergence surface 51 protrudes outward along a direction from the first semiconductor layer 3 toward the light-emitting layer 4. The surface of the first protective layer 6 away from the second semiconductor layer 5 is a second convergence surface 61. The second convergence surface 61 protrudes outward along a direction from the light-emitting layer 4 toward the second semiconductor layer 5. The first protective layer 6 has a second bottom surface 62, and the second bottom surface 62 is in contact with the first convergence surface 51 and is directly connected to the second convergence surface 61.

By the above setting, when the light emitted from the light-emitting surface of the light-emitting layer 4 enters the first convergence surface 51, the incident light on the first convergence surface 51 will be refracted on the first convergence surface 51, and the angle of emergence of refracted light on the first convergence surface 51 will decrease, so that the refracted light will converge toward a center of the first protective layer 6, thereby improving the collimation effect of the light-emitting diode 10. Further, when the refracted light emitted from the first convergence surface 51 enters the second convergence surface 61, incident light on the second convergence surface 61 will be refracted on the second convergence surface 61, and an angle of emergence of refracted light on the second convergence surface 61 will decrease, so that the refracted light will converge toward the center of the light-emitting diode 10 and act as emission light to be emitted, thereby further improving the collimation effect of the light-emitting diode 10.

It should be noted that in some embodiments, the light-emitting diode 10 may also include only one of the first convergence surface 51 or the second convergence surface 61. At this time, the convergence surface is the surface of the second semiconductor layer 5 away from the light-emitting layer 4 or the surface of the first protective layer 6 away from the second semiconductor layer 5, and is not repeated herein.

Further, in this embodiment, an orthographic projection of the first protective layer 6 on a plane where the first semiconductor layer 3 is located is within an orthographic projection of the second semiconductor layer 5 on the plane where the first semiconductor layer 3 is located, and in a direction from the first semiconductor layer 3 to the light-emitting layer 4, a horizontal cross-sectional area of the second semiconductor layer 5 decreases. A surface of the first protective layer 6 adjacent to the light-emitting layer 4 matches a surface of the second semiconductor layer 5 away from the light-emitting layer 4, and this setting can further improve the collimation effect of the light-emitting diode 10.

It should be noted that in this embodiment, structures of the second semiconductor layer 5 and the first protective layer 6 are only for illustration, and are used to facilitate the description of the embodiments, but should not be construed as a limitation on the present disclosure. In some embodiments, the second semiconductor layer 5 further has a first connecting surface (not shown in the figure) connecting the first convergence surface 51 and the first bottom surface 52, and the first connecting surface may protrude outward in a direction away from the first convergence surface 51. The first protective layer 6 has a second connecting surface (not shown in the figure) connecting the second convergence surface 61 and the second bottom surface 62, and the second connecting surface may protrude outward in a direction away from the second convergence surface 61, which will not be repeated here.

The second protective layer 7 is disposed on one side of the first semiconductor layer 3 away from the buffer layer 2 and is adjacent to the light-emitting layer 4. A thickness of the second protective layer 7 is less than a thickness of the light-emitting layer 4. Specifically, the second protective layer 7 is on a same layer as the light-emitting layer 4, and one side surface of the second protective layer 7 is in contact with one side surface of the light-emitting layer 4. Wherein, the second protective layer 7 may be manufactured by a same process as the first protective layer 6, and a material of the second protective layer 7 may include one or more of silicon oxide, silicon nitride, or silicon oxynitride.

The first electrode 8 is disposed on one side of the first protective layer 6 away from the second semiconductor layer 5, that is, the first electrode 8 is disposed on the second convergence surface 61. The second electrode 9 is disposed on one side of the second protective layer 7 away from the first semiconductor layer 3. In this embodiment, the first electrode 8 is a P-type electrode, and the second electrode 9 is an N-type electrode.

The present disclosure further provides the light-emitting substrate. The light-emitting substrate may be used as a backlight product to provide a light source required for LCDs, or the light-emitting substrate may also be directly used in direct view display products. This embodiment only takes a structure of the light-emitting substrate as a backlight product as an example for description, but is not limited thereto.

Figure 2:
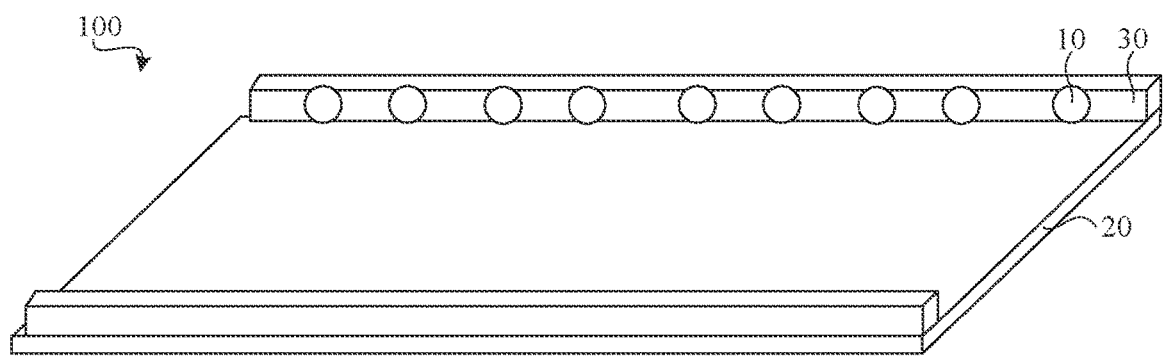
FIG. 2 is a schematic structural diagram of a light-emitting substrate according to an embodiment of the present disclosure.

Specifically, referring to FIG. 2, the light-emitting substrate 100 includes a substrate 20, a light board 30, and a light-emitting diode 10. The light board 30 is disposed on the substrate 20 and is located on at least one side edge of the substrate 20. The light-emitting diode 10 is disposed on an inner surface of the light board 30.

In this embodiment, the substrate 20 is provided with two light boards 30. The two light boards 30 are disposed opposite to each other at the edges of the substrate 20 and are located on a long-side direction of the substrate 20, thereby improving light-emitting uniformity of the light-emitting substrate 100. Wherein, light-emitting diodes 10 disposed on one light board 30 is arranged corresponding to light-emitting diodes 10 disposed on the other light board 30 by one-to-one.

The light-emitting diodes 10 may be the light-emitting diode 10 described in the foregoing example, and a specific structure of the light-emitting diodes 10 may refer to the description of the foregoing example, which will not be repeated here.

It should be noted that in some embodiments, the two light boards 30 on the substrate 20 may also be disposed in a short-side direction of the substrate 20, or in some embodiments, the substrate 20 may also be provided with one light board 30, three light boards 30, or four light boards 30. A location and a number of the light boards 30 on the substrate 20 are not specifically limited in the present disclosure.

In the light-emitting substrate 100 provided in the present disclosure, the collimation effect of the light-emitting substrate 100 can be improved by using the light-emitting diode 10 described in the foregoing example, which has high collimation, thereby improving a light-emitting brightness of the light-emitting substrate 100 and the light-emitting uniformity of the light-emitting substrate 100 at a same time.

Figure 3:
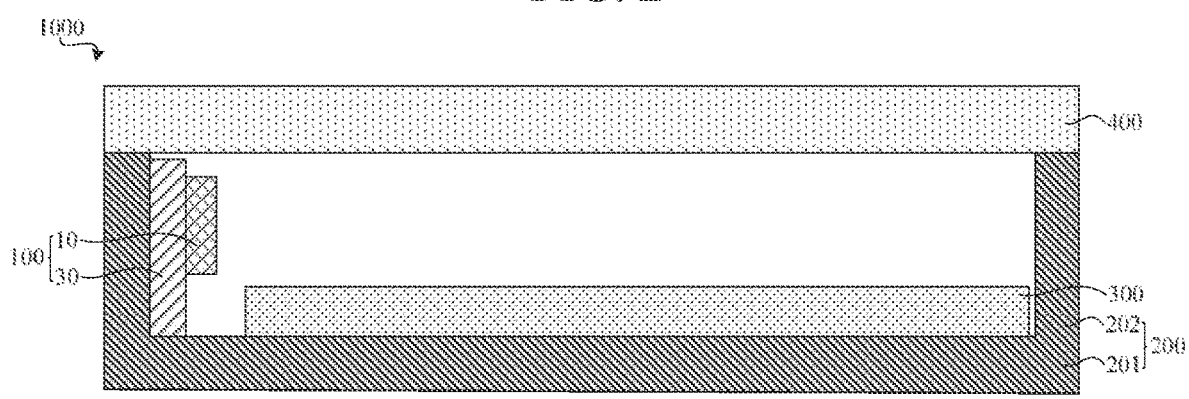
FIG. 3 is a schematic structural diagram of a display device according to a first embodiment of the present disclosure.

Referring to FIG. 3, a first embodiment of the present disclosure provides a display device 1000. The display device 1000 includes a framework 200, a total reflective liquid crystal display panel 300, a light-emitting substrate 100, and a coverplate 400. The framework 200 includes a bottom plate 201 and a side wall 202 disposed on the bottom plate 201. The total reflective liquid crystal display panel 300 is disposed on the bottom plate 201. The light-emitting substrate 100 is disposed on an inner surface of the side wall 202. One side of the light-emitting substrate 100 provided with the light-emitting diode 10 faces the total reflective liquid crystal display panel 300. The coverplate 400 is attached to an upper surface of the side wall 202.

It should be noted that for facilitating the description of the present disclosure, the display device 1000 in the following embodiments of the present disclosure only shows the structures of the light board 30 and the light-emitting diode 10 of the light-emitting substrate 100, but it should not be construed as a limitation on the present disclosure. In addition, a structure of the light-emitting substrate 100 here is same as the structure of the light-emitting substrate 100 described in the foregoing embodiment, and a specific structure of the light-emitting substrate 100 may refer to the description of the foregoing embodiment, which will not be repeated here.

In the display device 1000 provided in this embodiment, an additional light source is provided to the total reflective liquid crystal display panel 300 by disposing the light-emitting substrate 100 on the side wall 202 of the framework 200, thereby improving the brightness of the display device 1000, and preventing brightness of the display screen from being reduced due to lower brightness of ambient light. In addition, since the light-emitting substrate 100 has a good collimation effect, the brightness uniformity of the display device 1000 may also be improved.

Figure 4:
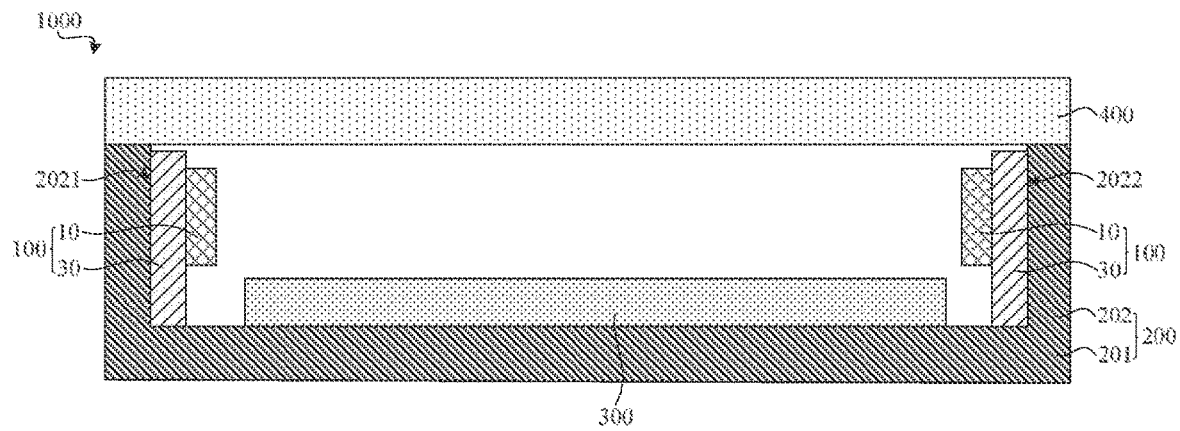
FIG. 4 is a schematic structural diagram of the display device according to a second embodiment of the present disclosure.
Figure 5:
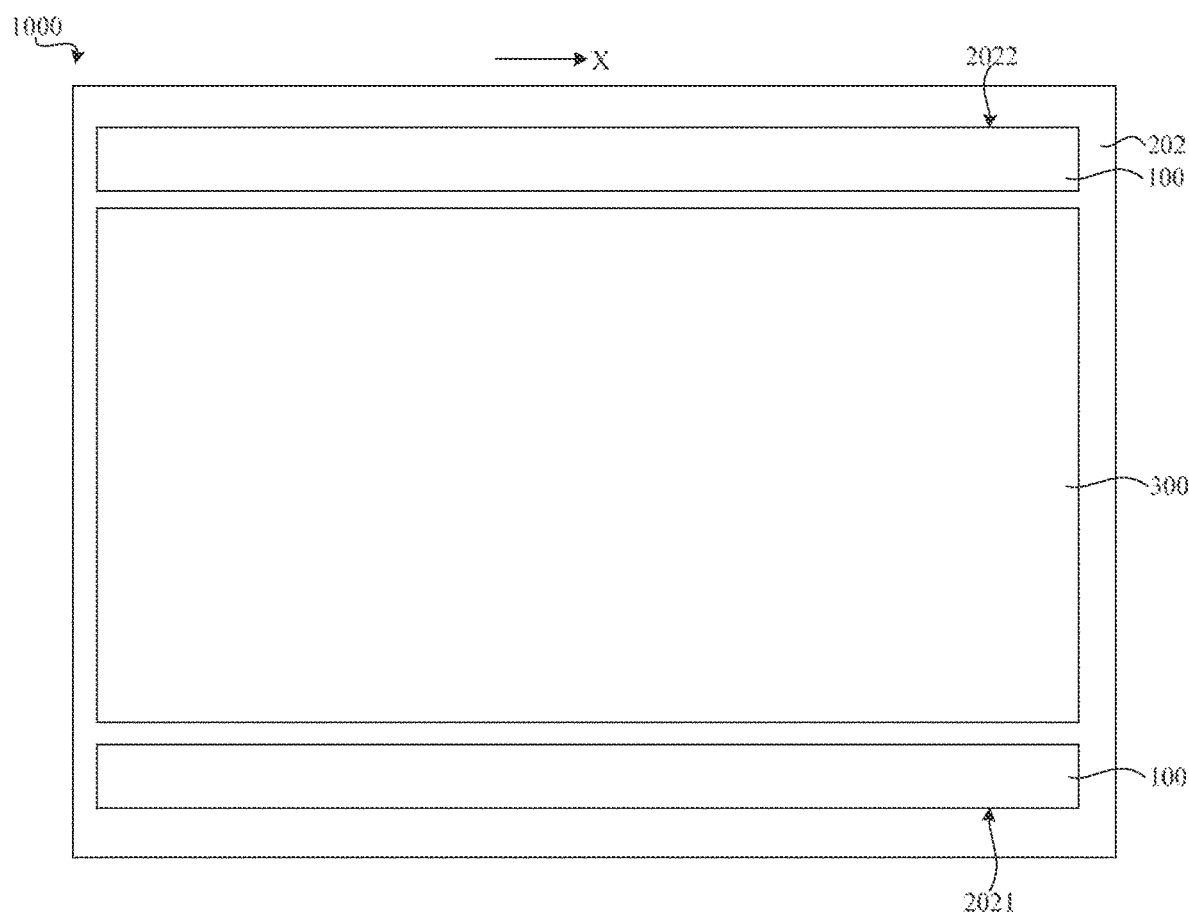
FIG. 5 is a schematic planar structural diagram of the display device according to the second embodiment of the present disclosure.

Referring to FIGS. 4 and 5, a second embodiment of the present disclosure provides the display device 1000. A difference between the display device 1000 provided in the second embodiment of the present disclosure and that in the first embodiment is that in a long-side direction X of the display device 1000, the side wall 202 has a first inner surface 2021 and a second inner surface 2022 defined opposite to each other, and the first inner surface 2021 and the second inner surface 2022 are both provided with the light-emitting substrate 100.

In this embodiment, by disposing two light-emitting substrates 100 in the long-side direction X of the display device 1000, the brightness uniformity of the display device 1000 can be further improved while improving the brightness of the display device 1000.

Figure 6:
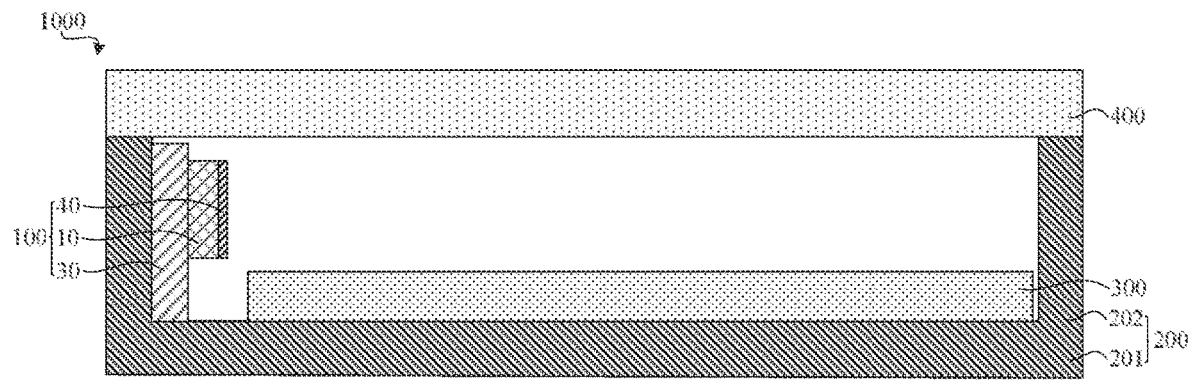
FIG. 6 is a schematic structural diagram of the display device according to a third embodiment of the present disclosure.
Figure 7:
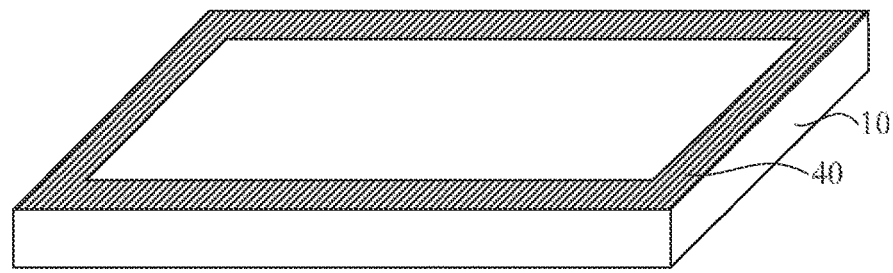
FIG. 7 is a schematic three-dimensional structural diagram of the light-emitting diode and a first light-blocking part of the display device according to the third embodiment of the present disclosure.

Referring to FIGS. 6 and 7, a third embodiment of the present disclosure provides the display device 1000. A difference between the display device 1000 provided in the third embodiment of the present disclosure and that in the first embodiment is that the light-emitting substrate 100 further includes a first light-blocking part 40, which is disposed on one side of the light-emitting diode 10 facing the total reflective liquid crystal display panel 300 and covers peripheries of the light-emitting diode 10.

In this embodiment, the light-emitting diode 10 emits light from one side, that is, an upper surface of the light-emitting diode 10 is the light-emitting surface. In this embodiment, by disposing the first light-blocking part 40 around the light-emitting diode 10, the light-blocking effect of the first light-blocking part 40 is used to make the peripheries of the light-emitting diode 10 be unable to transmit light, which prevents light from emitting from edges of the light-emitting diode 10, thereby decreasing a light-emitting angle and further improving the collimation effect of the light-emitting substrate 100. Therefore, it is beneficial to further improve the brightness uniformity of the display device 1000.

In this embodiment, the first light-blocking part 40 may be formed by dispensing process. Specifically, the first light-blocking part 40 is an opaque white glue, and a material of the white glue may be silica gel doped with titanium dioxide. In some embodiments, the material of the first light-blocking part 40 may also be a black light-shielding material. For example, a black pigment may be doped into the silica gel to realize a light-shielding effect. The material of the first light-blocking part 40 is not limited in the present disclosure.

Figure 8:
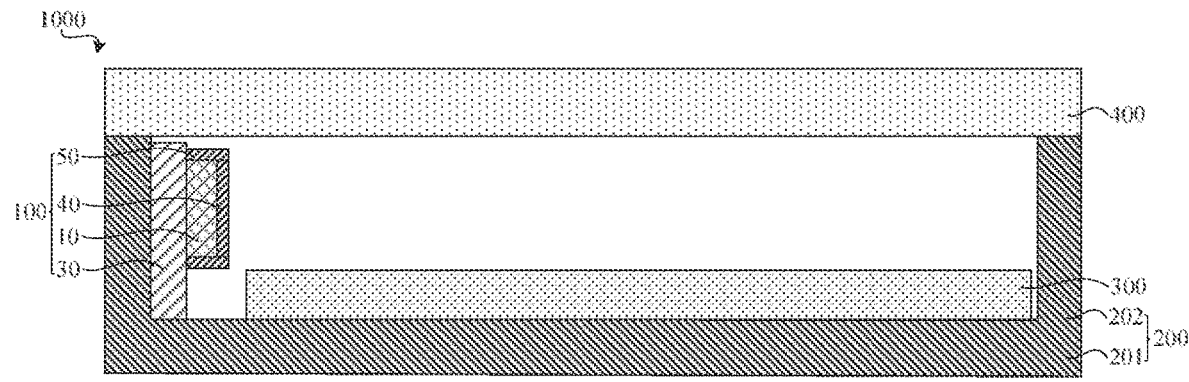
FIG. 8 is a schematic structural diagram of the display device according to a fourth embodiment of the present disclosure.
Figure 9:
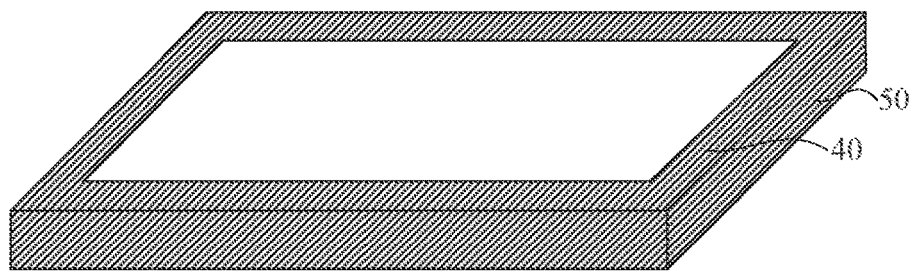
FIG. 9 is a schematic three-dimensional structural diagram of the light-emitting diode, the first light-blocking part, and a second light-blocking part of the display device according to the fourth embodiment of the present disclosure.

Referring to FIGS. 8 and 9, a fourth embodiment of the present disclosure provides the display device 1000. A difference between the display device 1000 provided in the fourth embodiment of the present disclosure and that in the third embodiment is that the light-emitting substrate 100 further includes a second light-blocking part 50 covering a side surface of the light-emitting diode 10.

In this embodiment, the light-emitting diode 10 emits light from five sides, that is, the upper surface and four side surfaces of the light-emitting diode 10 are all light-emitting surfaces. In this embodiment, by disposing the second light-blocking part 50 on side surfaces of the light-emitting diode 10, the light-blocking effect of the second light-blocking part 50 is used to make the side surfaces of the light-emitting diode 10 be unable to transmit light, which prevents light from emitting from the side surfaces of the light-emitting diode 10, thereby further improving the collimation effect of the light-emitting substrate 100. Therefore, it is beneficial to further improve the brightness uniformity of the display device 1000.

In this embodiment, a material of the second light-blocking part 50 may be same as that of the first light-blocking part 40, which may be the silica gel doped with titanium dioxide. In some embodiments, the material of the second light-blocking part 50 may also be different from that of the first light-blocking part 40, and at this time, the material of the second light-blocking part 50 may be the silica gel doped with black pigments. Under this setting, the light-blocking effect of the second light-blocking part 50 is better than that of the first light-blocking part 40.

Figure 10:
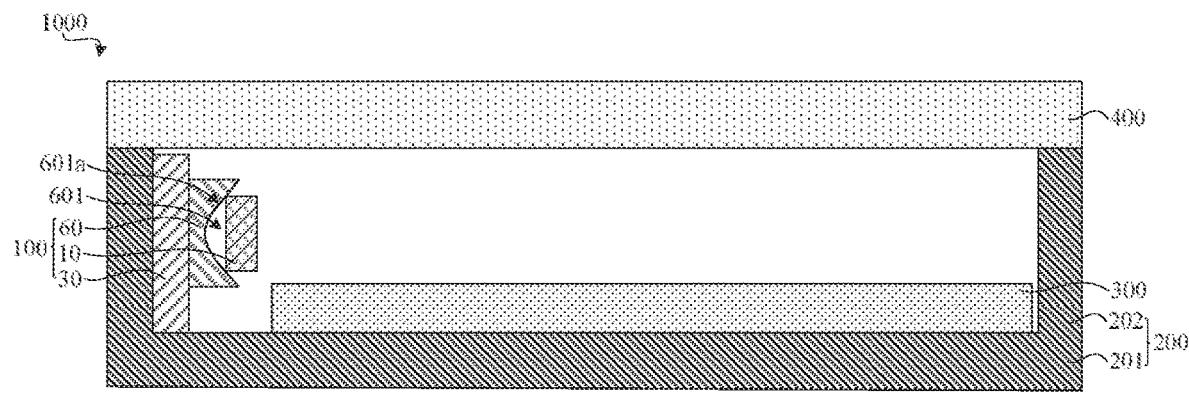
FIG. 10 is a schematic structural diagram of the display device according to a fifth embodiment of the present disclosure.

Referring to FIG. 10, a fifth embodiment of the present disclosure provides the display device 1000. A difference between the display device 1000 provided in the fifth embodiment of the present disclosure and that in the first embodiment is that the light-emitting substrate 100 further includes a reflective component 60 disposed on the substrate 20, one side of the reflective component 60 away from the substrate 20 is provided with a groove 601, a surface of the groove 601 is a reflective curved surface 601a, and the light-emitting diode 10 is accommodated in the groove 601.

In this embodiment, the light-emitting substrate 100 is provided with the reflective component 60, and the light-emitting diode 10 is accommodated in the groove 601 of the reflective component 60. Since the surface of the groove 601 is the reflective curved surface 601a, when light at a large angle emitted from the light-emitting diode 10 is incident on the surface of the groove 601, the incident light incident on the reflective curved surface 601a will be reflected and re-emitted to the light-emitting diode 10, thereby realizing a light collimation effect. Therefore, the loss of light emitted from the edges of the light-emitting diode 10 at the large angle is reduced, so that the light at the edges of the light-emitting diode 10 and in a central area of the light-emitting diode 10 is homogenized, thereby further improving the collimation effect of the light-emitting substrate 100 and the brightness uniformity of the display device 1000.

In this embodiment, the reflective component 60 is a reflective cover, and the reflective cover may cover the light-emitting diode 10. When a material of the reflective component 60 is a reflective material such as silver, the reflective surface is provided by the reflective cover itself. When the material of the reflective component 60 is a non-reflective material, the reflective surface may be obtained by attaching or coating a reflective layer. As long as it can ensure that the surface of the groove 601 is a curved surface having the reflective effect, it is within the protection scope of the present disclosure.

Figure 11:
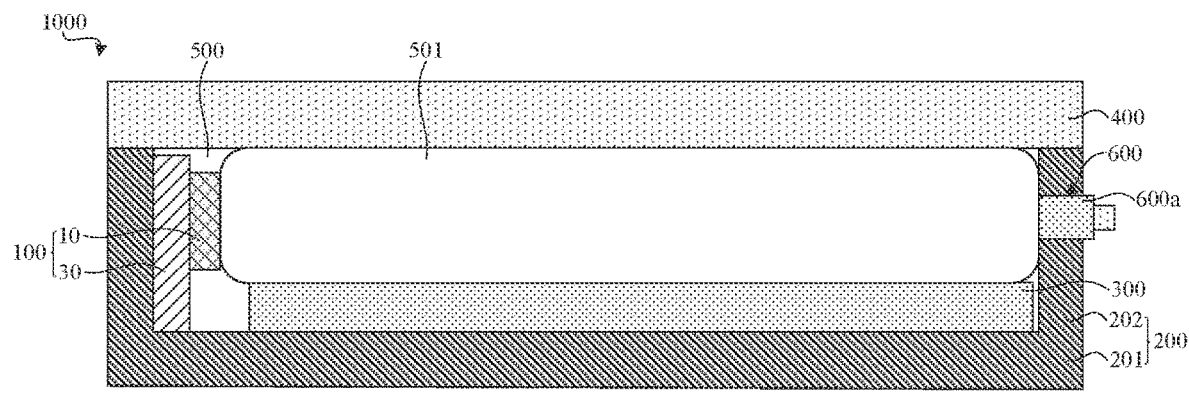
FIG. 11 is a schematic structural diagram of the display device according to a sixth embodiment of the present disclosure.

Referring to FIG. 11, a sixth embodiment of the present disclosure provides the display device 1000. A difference between the display device 1000 provided in the sixth embodiment of the present disclosure and that in the first embodiment is that the coverplate 400 and the framework 200 together form a closed chamber 500, the closed chamber 500 is provided with an air bag 501, a gas for refraction is filled in the air bag 501, and a refractive index of the gas for refraction is greater than the refractive index of the air.

In current technology, the medium between the total reflective liquid crystal display panel 300 and the light-emitting substrate 100 is the air, and the refractive index of the air is 1.000292. After the light emitted from the light-emitting substrate 100 is refracted by the air, an angle between the refracted light and the normal line is large, and the light entering the total reflective liquid crystal display panel 300 is more divergent, making the uniformity between the light at the edges of the panel and the central area of the panel is poorer.

Therefore, in this embodiment, by replacing the air in the closed chamber 500 with the gas for refraction which has the refractive index greater than the air, after the light emitted from the light-emitting substrate 100 is refracted by the gas for refraction in the air bag 501, the angle between the refracted light and the normal line becomes smaller, thereby improving the collimation effect of the incident light on the total reflective liquid crystal display panel 300. Therefore, the light at the edges and the central area of the total reflective liquid crystal display panel 300 can be homogenized, thereby improving the brightness uniformity of the display device 1000.

In this embodiment, the gas for refraction is stored in the air bag 501, so the airtightness of the gas for refraction can be greatly improved. The gas for refraction may be a non-toxic and harmless gas such as nitrogen, and a type of the gas for refraction is not specifically limited in this embodiment.

Further, at least one of the coverplate 400 or the framework 200 is provided with an inflatable port 600 connected to the air bag 501. In this embodiment, the inflatable port 600 is disposed on the side wall 202 of the framework 200. The inflatable port 600 is provided with an inflatable sealing device 600a. The inflatable sealing device 600a includes a valve (not shown in the figure), when the valve is opened, the air bag 501 is filled with the gas for refraction by an inflatable pump (not shown in the figure).

Figure 12:
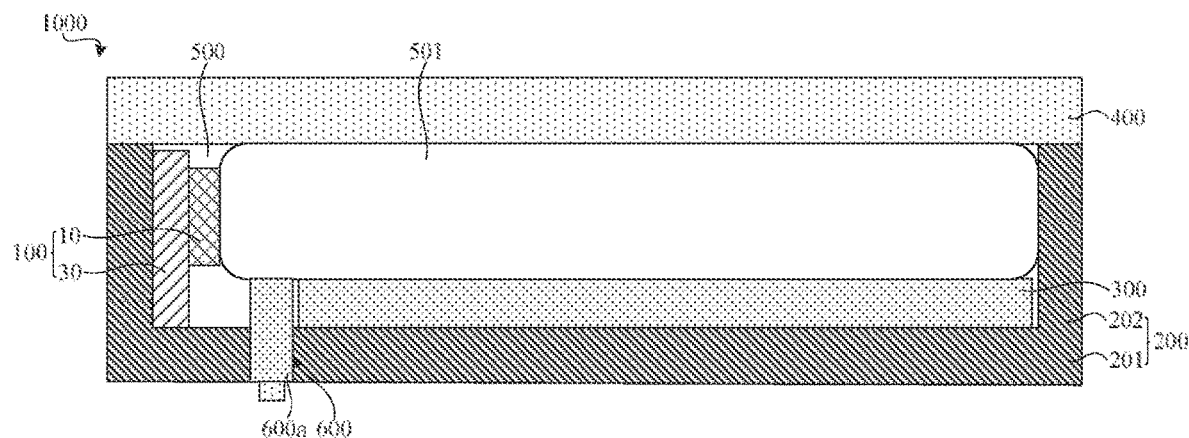
FIG. 12 is a schematic structural diagram of the display device according to a seventh embodiment of the present disclosure.
Figure 13:
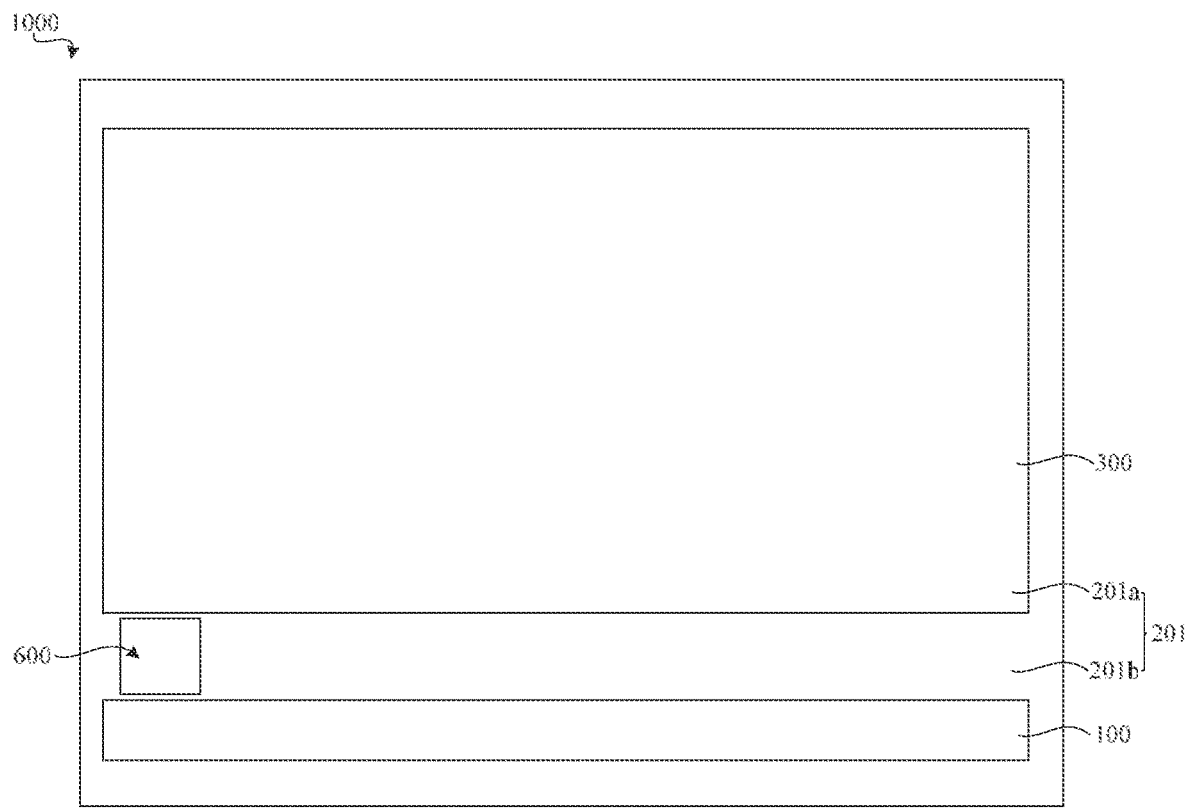
FIG. 13 is a schematic planar structural diagram of the display device according to the seventh embodiment of the present disclosure.

Referring to FIGS. 12 and 13, a seventh embodiment of the present disclosure provides the display device 1000. A difference between the display device 1000 provided in the seventh embodiment of the present disclosure and that in the sixth embodiment is that the bottom plate has a first section 201a and a second section 201b adjacent to the first section 201a, the total reflective liquid crystal display panel 300 is disposed on the first section 201a, and the inflatable port 600 is disposed on the second section 201b.

In this embodiment, disposing the inflatable port 600 on the second section 201b of the bottom plate 201 can improve the aesthetics of the display device 1000. It should be noted that the second section 201b is a part of the bottom plate 201 where the total reflective liquid crystal display panel 300 is not disposed. The position of the second section 201b in this embodiment is only for illustration and is used to describe this embodiment conveniently, but should not be construed as a limitation of the present disclosure.

Figure 14:
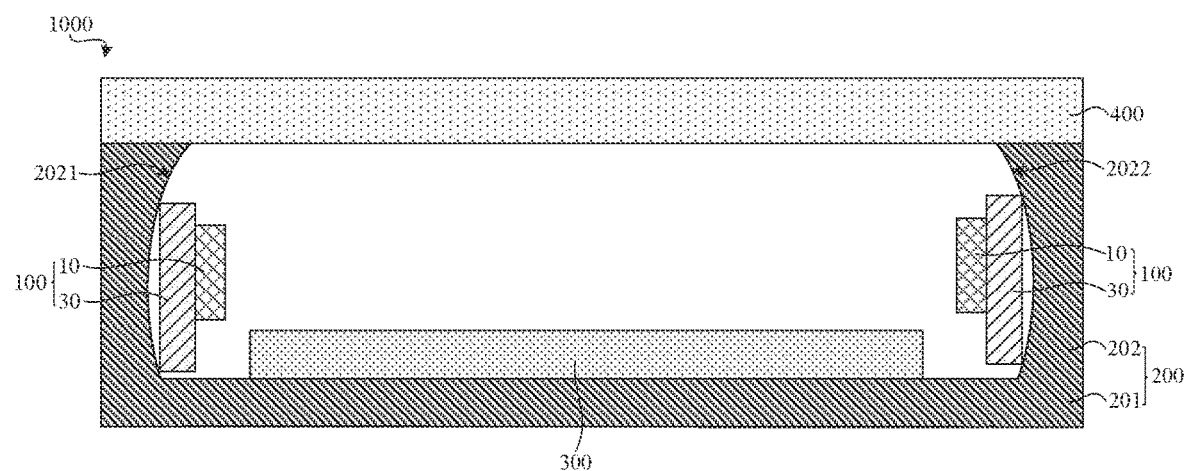
FIG. 14 is a schematic structural diagram of the display device according to an eighth embodiment of the present disclosure.

Referring to FIG. 14, an eighth embodiment of the present disclosure provides the display device 1000. A difference between the display device 1000 provided in the eighth embodiment of the present disclosure and that in the second embodiment is that the first inner surface 2021 and the second inner surface 2022 are both arc-shaped reflective concave surfaces.

In this embodiment, the inner surfaces of the side wall 202 provided with the light-emitting substrate 100 are designed as the arc-shaped reflective concave surfaces. When light at a large angle emitted from light-emitting substrates 100 is incident on the reflective concave surfaces, the incident light will be reflected by the first inner surface 2021 and the second inner surface 2022 and re-emitted to corresponding light-emitting substrates 100, thereby realizing the light collimation effect. Therefore, the loss of light emitted from the edges of the light-emitting substrate 100 at the large angle is reduced, so that the light at the edges and in the central area of the light-emitting substrate 100 is homogenized, thereby further improving the collimation effect of the light-emitting substrate 100 and the brightness uniformity of the display device 1000.

Figure 15:
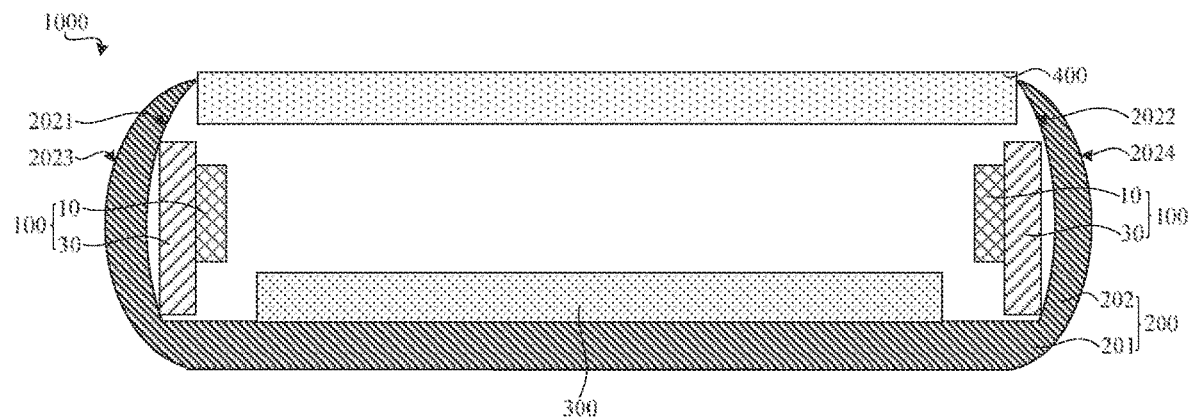
FIG. 15 is a schematic structural diagram of the display device according to a ninth embodiment of the present disclosure.

Referring to FIG. 15, a ninth embodiment of the present disclosure provides the display device 1000. A difference between the display device 1000 provided in the ninth embodiment of the present disclosure and that in the eighth embodiment is that an outer surface of the side wall 202 is also an arc-shaped reflective concave surface.

Specifically, a first outer surface 2023 corresponding to the first inner surface 2021 and a second outer surface 2024 corresponding to the second inner surface 2022 on the side wall 202 are both arc-shaped reflective concave surfaces.

In this embodiment, the outer surfaces of the side wall 202 provided with the light-emitting substrates 100 are designed as the arc-shaped reflective concave surfaces. At this time, the side wall 202 is an arc structure. When a part of the light at the large angle emitted from the inner surfaces of the side wall 202 are incident on the first outer surface 2023 and the second outer surface 2024 of the side wall 202, a part of the incident light will be reflected and re-emitted toward the light-emitting substrate 100, thereby improving utilization of light.

Figure 16:
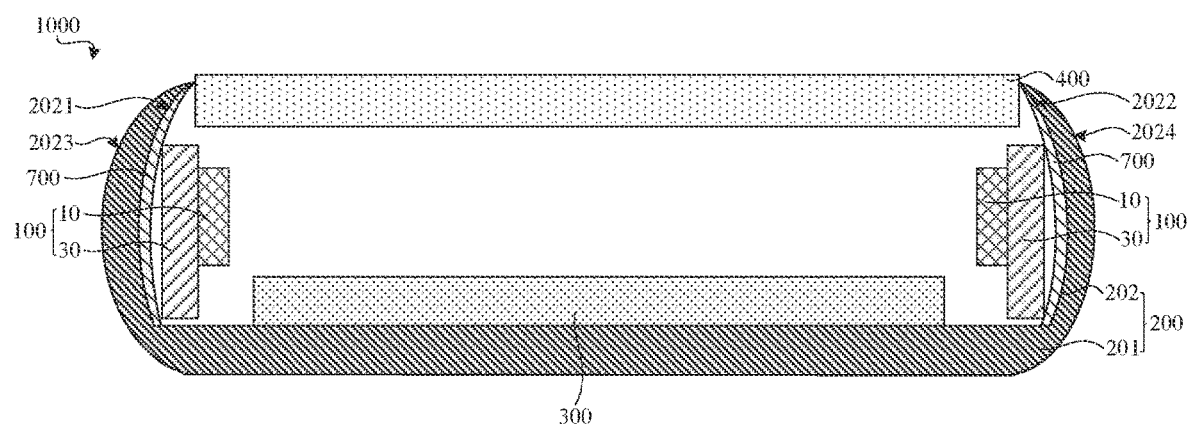
FIG. 16 is a schematic structural diagram of the display device according to a tenth embodiment of the present disclosure.

Referring to FIG. 16, a tenth embodiment of the present disclosure provides the display device 1000. A difference between the display device 1000 provided in the tenth embodiment of the present disclosure and that in the ninth embodiment is that the display device 1000 further includes a reflective layer 700, and the reflective layer 700 is disposed on the reflective concave surfaces.

Specifically, the first inner surface 2021 and the second inner surface 2022 are provided with the reflective layer 700, respectively. Wherein, the reflective layer 700 may be a reflective sheet or a white oil layer. When the light at the large angle emitted from light-emitting substrates 100 is incident on the reflective layer 700, the incident light will be reflected by the reflective layer 700 and re-emitted to the light-emitting substrates 100, thereby realizing the light collimation effect. Therefore, the loss of light emitted from the edges of the light-emitting substrate 100 at the large angle can be reduced, thereby further improving the collimation effect of the light-emitting substrate 100. Therefore, the brightness uniformity of the display device 1000 can be further improved.

The light-emitting diode, the light-emitting substrate, and the display device provided in the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A light-emitting diode, comprising:
a first semiconductor layer;
a light-emitting layer disposed on the first semiconductor layer;
a second semiconductor layer disposed on one side of the light-emitting layer away from the first semiconductor layer and located on a light-emitting surface of the light-emitting layer; and
a first protective layer disposed on one side of the second semiconductor layer away from the light-emitting layer;
wherein the light-emitting diode comprises at least one convergence surface, and the at least one convergence surface comprises a surface of the second semiconductor layer away from the light-emitting layer or a surface of the first protective layer away from the second semiconductor layer;
wherein the surface of the second semiconductor layer away from the light-emitting layer is a first convergence surface, and the first convergence surface protrudes outward along a direction from the first semiconductor layer toward the light-emitting layer.

2. The light-emitting diode according to claim 1, wherein the second semiconductor layer has a first bottom surface, and the first bottom surface is in contact with the light-emitting surface of the light-emitting layer and is connected to the first convergence surface.

3. The light-emitting diode according to claim 2, wherein the surface of the first protective layer away from the second semiconductor layer is a second convergence surface, and the second convergence surface protrudes outward along a direction from the light-emitting layer toward the second semiconductor layer; and the first protective layer has a second bottom surface, and the second bottom surface is in contact with the first convergence surface and is connected to the second convergence surface.

4. The light-emitting diode according to claim 1, wherein an orthographic projection of the first protective layer on a plane where the first semiconductor layer is located is within an orthographic projection of the second semiconductor layer on the plane where the first semiconductor layer is located, and in a direction from the first semiconductor layer to the light-emitting layer, a horizontal cross-sectional area of the second semiconductor layer decreases.

5. A light-emitting substrate, comprising a substrate and a light-emitting diode disposed on the substrate, wherein the light-emitting diode is the light-emitting diode according to claim 1.

6. The light-emitting substrate according to claim 5, wherein the second semiconductor layer has a first bottom surface, and the first bottom surface is in contact with the light-emitting surface of the light-emitting layer and is connected to the first convergence surface.

7. The light-emitting substrate according to claim 6, wherein the surface of the first protective layer away from the second semiconductor layer is a second convergence surface, and the second convergence surface protrudes outward along a direction from the light-emitting layer toward the second semiconductor layer; and the first protective layer has a second bottom surface, and the second bottom surface is in contact with the first convergence surface and is connected to the second convergence surface.

8. The light-emitting substrate according to claim 5, wherein an orthographic projection of the first protective layer on a plane where the first semiconductor layer is located is within an orthographic projection of the second semiconductor layer on the plane where the first semiconductor layer is located, and in a direction from the first semiconductor layer to the light-emitting layer, a horizontal cross-sectional area of the second semiconductor layer decreases.

9. A display device, comprising:
a framework comprising a bottom plate and a side wall disposed on the bottom plate;
a total reflective liquid crystal display panel disposed on the bottom plate; and
a light-emitting substrate disposed on at least one inner surface of the side wall, wherein one side of the light-emitting substrate provided with a light-emitting diode faces the total reflective liquid crystal display panel, and the light-emitting substrate is the light-emitting substrate according to claim 5.

10. The display device according to claim 9, wherein in a long-side direction of the display device, the side wall has a first inner surface and a second inner surface disposed opposite to each other, and the first inner surface and the second inner surface are both provided with the light-emitting substrate.

11. The display device according to claim 9, wherein the light-emitting substrate further comprises a first light-blocking part disposed on one side of the light-emitting diode facing the total reflective liquid crystal display panel and covering peripheries of the light-emitting diode.

12. The display device according to claim 11, wherein the light-emitting substrate further comprises a second light-blocking part covering a side surface of the light-emitting diode.

13. The display device according to claim 9, wherein the light-emitting substrate further comprises a reflective component disposed on the substrate, one side of the reflective component away from the substrate is provided with a groove, a surface of the groove is a reflective curved surface, and the light-emitting diode is accommodated in the groove.

14. The display device according to claim 9, further comprising a coverplate, wherein the coverplate and the framework together form a closed chamber, the closed chamber is provided with an air bag, a gas for refraction is filled in the air bag, and a refractive index of the gas for refraction is greater than a refractive index of air.

15. The display device according to claim 14, wherein at least one of the coverplate or the framework is provided with an inflatable port connected to the air bag.

16. The display device according to claim 15, wherein the bottom plate has a first section and a second section adjacent to the first section, the total reflective liquid crystal display panel is disposed on the first section, and the inflatable port is disposed on the second section.

17. The display device according to claim 9, wherein the side wall is provided with a reflective concave surface having an arc shape, and the light-emitting substrate is disposed on the reflective concave surface.

18. The display device according to claim 17, further comprising a reflective layer disposed on the reflective concave surface.

* * * * *